(12) United States Patent
Kamel et al.

(10) Patent No.: US 11,359,290 B2
(45) Date of Patent: Jun. 14, 2022

(54) METHOD OF ADDITIVE MANUFACTURING OF COMPONENTS

(71) Applicant: Siemens Energy, Inc., Orlando, FL (US)

(72) Inventors: Ahmed Kamel, Orlando, FL (US); Anand A. Kulkarni, Charlotte, NC (US)

(73) Assignee: SIEMENS ENERGY, INC., Orlando, FL (US)

(*) Notice: Subject to any disclaimer, the term of this patent is extended or adjusted under 35 U.S.C. 154(b) by 313 days.

(21) Appl. No.: 16/478,331

(22) PCT Filed: Jan. 30, 2018

(86) PCT No.: PCT/US2018/015865
§ 371 (c)(1),
(2) Date: Jul. 16, 2019

(87) PCT Pub. No.: WO2018/140919
PCT Pub. Date: Aug. 2, 2018

(65) Prior Publication Data
US 2020/0009656 A1 Jan. 9, 2020

Related U.S. Application Data

(60) Provisional application No. 62/452,124, filed on Jan. 30, 2017.

(51) Int. Cl.
*C23C 28/00* (2006.01)
*B33Y 10/00* (2015.01)
(Continued)

(52) U.S. Cl.
CPC ............ *C23C 28/3455* (2013.01); *B22F 3/24* (2013.01); *B22F 10/20* (2021.01); *B23K 26/342* (2015.10);
(Continued)

(58) Field of Classification Search
None
See application file for complete search history.

(56) References Cited

U.S. PATENT DOCUMENTS

| 6,925,346 B1 | 8/2005 | Mazumder et al. |
| 2005/0092724 A1 | 5/2005 | Warren et al. |

(Continued)

FOREIGN PATENT DOCUMENTS

| CN | 101392382 A | 3/2009 |
| CN | 102962452 A | 3/2013 |

(Continued)

OTHER PUBLICATIONS

Clijsters S. et al: "In situ quality control of the selective laser melting process using a high-speed, real-time melt pool monitoring system" The International Journal of Advanced Manufacturing Technology, vol. 75, No. 5-8, Aug. 10, 2014 (Aug. 10, 2014), pp. 1089-1101, XP055320129; London; ISSN: 0268-3768, DOI: 10.1007/s00170-014-6214-8, the whole document / Aug. 10, 2014.

(Continued)

*Primary Examiner* — Colin W. Slifka

(57) ABSTRACT

A method of additive manufacturing a component. The method includes selecting powder characterization, depositing powder materials, inspecting the powder materials, selecting process and laser parameters for laser processing, laser processing the powder materials, performing layer cleanup, determining stress state and relieving, additionally inspecting the laser processed powder materials, and repeating steps until a buildup of the component is complete.

8 Claims, 3 Drawing Sheets

(51) Int. Cl.
| | |
|---|---|
| *B33Y 40/00* | (2020.01) |
| *B33Y 50/02* | (2015.01) |
| *B23K 26/342* | (2014.01) |
| *B22F 3/24* | (2006.01) |
| *F01D 5/28* | (2006.01) |
| *B22F 10/20* | (2021.01) |
| *C23C 28/04* | (2006.01) |
| *B22F 10/30* | (2021.01) |

(52) U.S. Cl.
CPC ............... *B33Y 10/00* (2014.12); *B33Y 40/00* (2014.12); *B33Y 50/02* (2014.12); *C23C 28/042* (2013.01); *C23C 28/3215* (2013.01); *F01D 5/288* (2013.01); *B22F 10/30* (2021.01); *B22F 2003/247* (2013.01); *B22F 2003/248* (2013.01)

(56) References Cited

U.S. PATENT DOCUMENTS

| | | |
|---|---|---|
| 2012/0217226 A1 | 8/2012 | Bayer et al. |
| 2013/0343947 A1 | 12/2013 | Satzger et al. |
| 2015/0158249 A1 | 6/2015 | Goto |
| 2015/0367572 A1 | 12/2015 | De Pena Hempel et al. |
| 2016/0236279 A1 | 8/2016 | Ashton et al. |
| 2016/0311025 A1 | 10/2016 | Kaneko |
| 2018/0207722 A1 | 7/2018 | Feldmann et al. |

FOREIGN PATENT DOCUMENTS

| | | |
|---|---|---|
| CN | 104226988 A | 12/2014 |
| CN | 104400998 A | 3/2015 |
| CN | 104956672 A | 9/2015 |
| CN | 104959600 A | 10/2015 |
| CN | 105033408 A | 11/2015 |
| CN | 105154870 A | 12/2015 |
| CN | 105195742 A | 12/2015 |
| CN | 105204791 A | 12/2015 |
| CN | 105239080 A | 1/2016 |
| CN | 105437549 A | 3/2016 |
| CN | 105745060 A | 7/2016 |
| CN | 106041076 A | 10/2016 |
| CN | 106077636 A | 11/2016 |
| EP | 1528110 A1 | 5/2005 |
| EP | 3170592 A1 | 5/2017 |
| EP | 3251844 A1 | 12/2017 |
| EP | 3308945 A1 | 4/2018 |
| JP | 2013028464 A | 2/2013 |
| JP | 2015112752 A | 6/2015 |
| JP | 2018524476 A | 8/2018 |
| WO | 2017015241 A1 | 1/2017 |

OTHER PUBLICATIONS

PCT International Search Report and Written Opinion of International Searching Authority dated May 8, 2018 corresponding to PCT International Application No. PCT/US2018/015865 filed Jan. 30, 2018.

Zhang, Xue-Jun et al: "Research Status and Key Technologies of 3D Printing"; Journal of Materials Engineering; vol. 44, No. 2, Year: Feb. 2016, pp. 122-128.

METHOD OF ADDITIVE MANUFACTURING OF COMPONENTS

BACKGROUND

1. Field

The present invention relates to a method of additive manufacturing of components.

2. Description of the Related Art

Laser based material deposition has been used for precise coating deposition and for additive layer manufacturing. Low energy efficiency of the process and comparably low deposition rates conflict with profitability and thus limit possible applications. Small chamber sizes limit the buildup of large parts in one piece.

Manufacturing near-net-shape components in a layer-by-layer fashion can offer a great potential for time and cost savings over conventional manufacturing technologies such as casting, forging, and machining. Currently, approaches include relying on a special nozzle design that provides a precise powder focus. Small bead size with small layer buildup in the 20-100 µm thickness range per pass are provided. These however, result in high accuracy at the expense of very slow deposition rates. Some of the advantages of the additive manufacturing over the more conventional manufacturing methods are lost due to the very slow deposition rates.

SUMMARY

In an aspect of the present invention, a method of additive manufacturing a component, the method comprises: selecting powder characterization; depositing powder materials for fabricating the component; inspecting, in-situ, the powder materials deposited to determine layer characteristics; selecting process and laser parameters for laser processing based on inspection results; laser processing the powder materials; performing layer cleanup on the laser processed powder materials; additionally inspecting, in-situ, the laser processed powder materials to determine material characteristics; inspecting via ultrasonic measurement process the laser processed powder materials to determine residual stress; upon determining residual stress is less than a threshold, repeating the above steps starting with the depositing step with additional powder materials until a buildup of the component is complete.

These and other features, aspects and advantages of the present invention will become better understood with reference to the following drawings, description and claims.

BRIEF DESCRIPTION OF THE DRAWINGS

The invention is shown in more detail by help of figures. The figures show preferred configurations and do not limit the scope of the invention.

DETAILED DESCRIPTION

In the following detailed description of the preferred embodiment, reference is made to the accompanying drawings that form a part hereof, and in which is shown by way of illustration, and not by way of limitation, a specific embodiment in which the invention may be practiced. It is to be understood that other embodiments may be utilized and that changes may be made without departing from the spirit and scope of the present invention.

Broadly, a method of additive manufacturing a component. The method includes selecting powder characterization, depositing powder materials, inspecting the powder materials, selecting process and laser parameters for laser processing, laser processing the powder materials, performing layer cleanup, additionally inspecting the laser processed powder materials, and repeating steps until a buildup of the component is complete.

An additive manufacturing process that includes high deposition rates and large volumes is desired. The embodiments of the process described below include embodiments that can be applied to closed, such as in selective laser melting (SLM), and open air, such as in cladding, deposition systems. These embodiments can produce height differences among the layers within a final build-up.

Typical with manufacturing processes, selective laser heating processes such as SLM and selective laser sintering (SLS) result in physical characteristics, such as defect and/or a buildup of residual stress. A simulation may take place prior to laser processing. However, simulation is not effective when handling variable heights within the additive manufacturing process.

Figure 3:
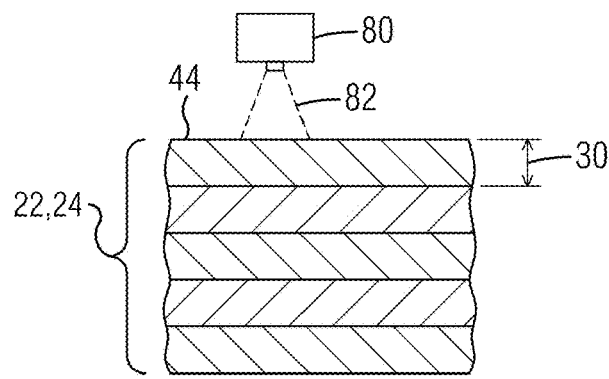
FIG. 3 depicts a flash thermography characteristics detection process of an exemplary embodiment of the present invention.
Figure 4:
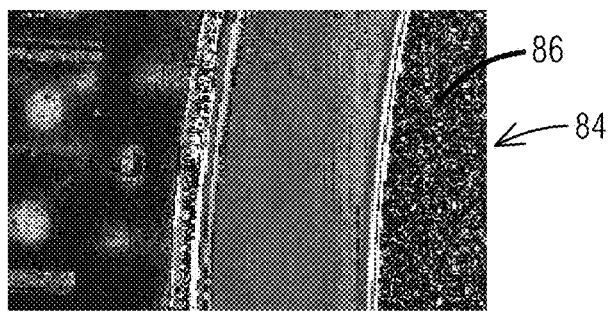
FIG. 4 powder layup thickness based off of a flash thermography characteristics detection process of an exemplary embodiment of the present invention.
Figure 5:
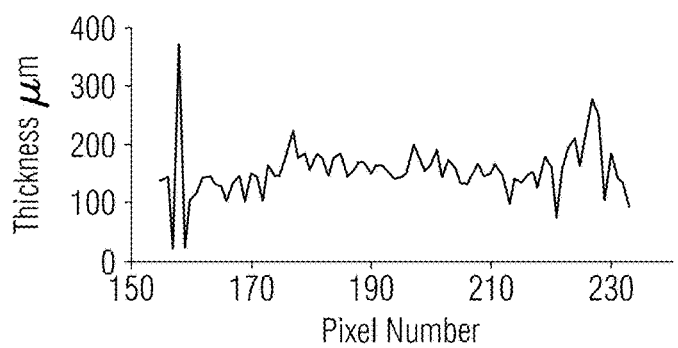
FIG. 5 is a chart depicting pixel number versus thickness of a sample based off of a flash thermography characteristics detection process of an exemplary embodiment of the present invention.

To initiate an embodiment of an additive manufacturing process, powder characterization occurs. The size of each layer, the total height requirements, the materials used, along with other powder characterizations are determined in an initial step. These characteristics determine the laser interaction. A powder feed and layup begin depositing powder material. When deposited, the layer thickness and powder bed density is important to identify and keep as required throughout the process. These layer characteristics among others are evaluated by an inspection as shown in FIGS. 3 through 5. The inspection can be through flash thermography or similar readings of the powder material. The term flash thermography is used interchangeably with the term inspection unless otherwise stated.

Layer characteristics such as conductivity can also be evaluated by the flash thermography step in the process. Further, the flash thermography can also map defects such as porosity in the layer or crack in the layer. Based on the evaluation of the flash thermography results, laser processing and process parameters can be selected. Further, if there are any defects or non-obtained parameters, these values can affect the process parameters. These process parameters can be selected from a database of preset parameters.

Figure 6:
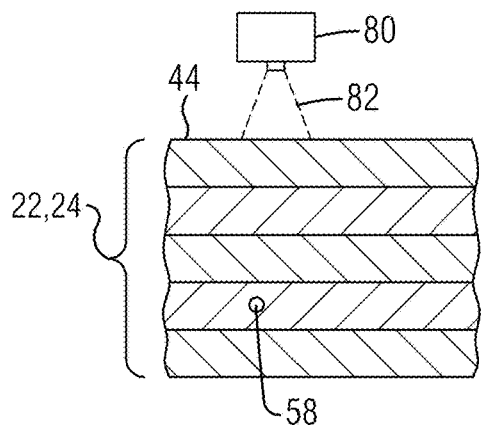
FIG. 6 depicts a flash thermography characteristics detection process of an exemplary embodiment of the present invention.
Figure 7:
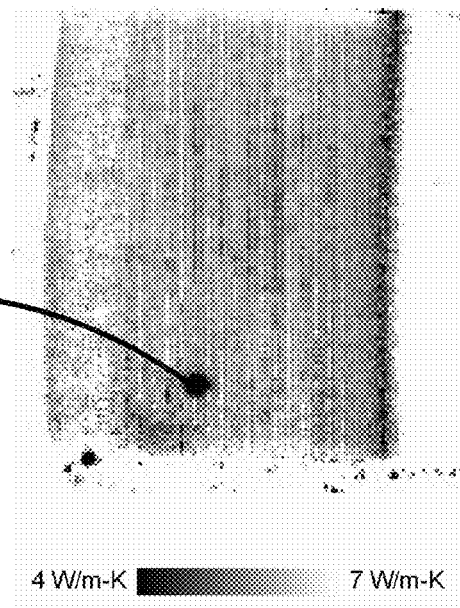
FIG. 7 thermal conductivity of a metallic deposit based off of a flash thermography characteristics detection process of an exemplary embodiment of the present invention.
Figure 8:
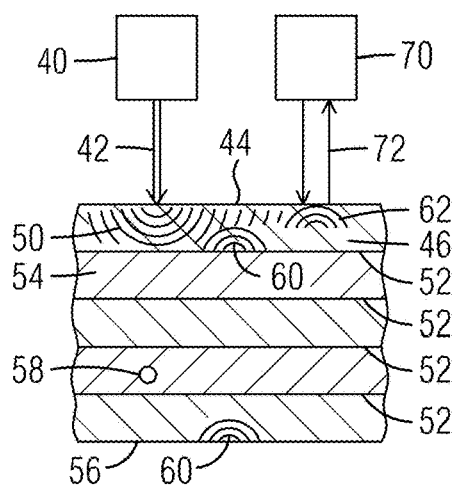
FIG. 8 depicts a laser ultrasonic residual stress detection process of an exemplary embodiment of the present invention.
Figure 9:
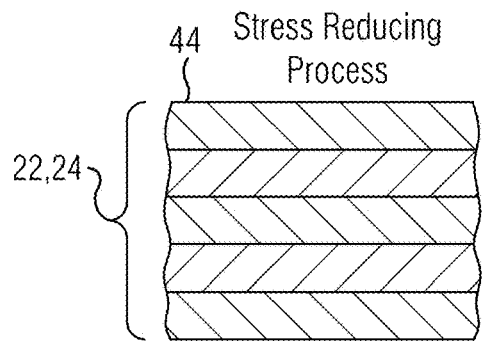
FIG. 9 depicts an option of performing a residual stress-relieving process after the laser ultrasonic physical characteristic detection process of an exemplary embodiment of the present invention.

Laser processing is then performed. After the laser processing, a layer cleanup is performed to remove excess material or the like. Another round of flash thermography is performed to obtain and evaluate deposit characteristics such as, but not limited to, thickness, conductivity, and delamination/cracking. FIGS. 6 and 7 show the flash thermography and sample results that happen to have a defect as shown. The thermal conductivity of the deposited material can correlate to the density of the material.

At this stage in the process after the evaluation of the flash thermography results, if not satisfying the requirements, the process loops back to selecting process and laser processing parameters to continue with the laser processing once again.

During the laser processing, rapid temperature cycles and steep temperature gradients occur in the scanned layers. Temperature gradients induce thermal stresses that can remain in the part upon completion of the process, i.e. residual stress. These residual stresses can be detrimental to the functionality and structural integrity of the built parts. Laser ultrasonics can be an in-situ and non-destructive measurement of residual stress that can be included in the process. Measuring and evaluating the residual stress in the layer can enable control of the residual stress levels. Controlling the residual stress can avoid warping of the part and also premature cracking. If after the evaluation, the residual stress levels are below a certain threshold, the process can loop back to set up the powder feed and layup to continue building an additional powder material layer. If the value is equal to or higher than the threshold, a residual stress reducing process can be performed. A residual stress reducing process such as a laser shock peening technique can be performed to relieve these stresses. Once the residual stresses are relieved, the process loops back to the step for set up of the powder feed and layup, i.e. deposition of powder materials.

Embodiments include dedicated efforts in the areas of powder characteristics, deposit characteristics, and residual stresses so that an integrated closed loop is formed. A thicker layer can be produced for bulk areas of a final product, and for areas with fine details, a thinner layer can be produced. The layer thickness can vary with each layer due to the closed loop control. As mentioned above, typical layer buildup size runs from 20-100 µm. Layer size can increase to 150 µm-4 mm with embodiments described here within. The thicker layer sizes can be used for bulk areas as mentioned above, while fine detailed areas can be reduced to the typical thinner layer size. Typical speeds for a traditional additive manufacturing process run from 30 to 40 hours. Enabled to change layer thickness, the process including an embodiment described here, can now run approximately 4 hours in time.

Figure 1:
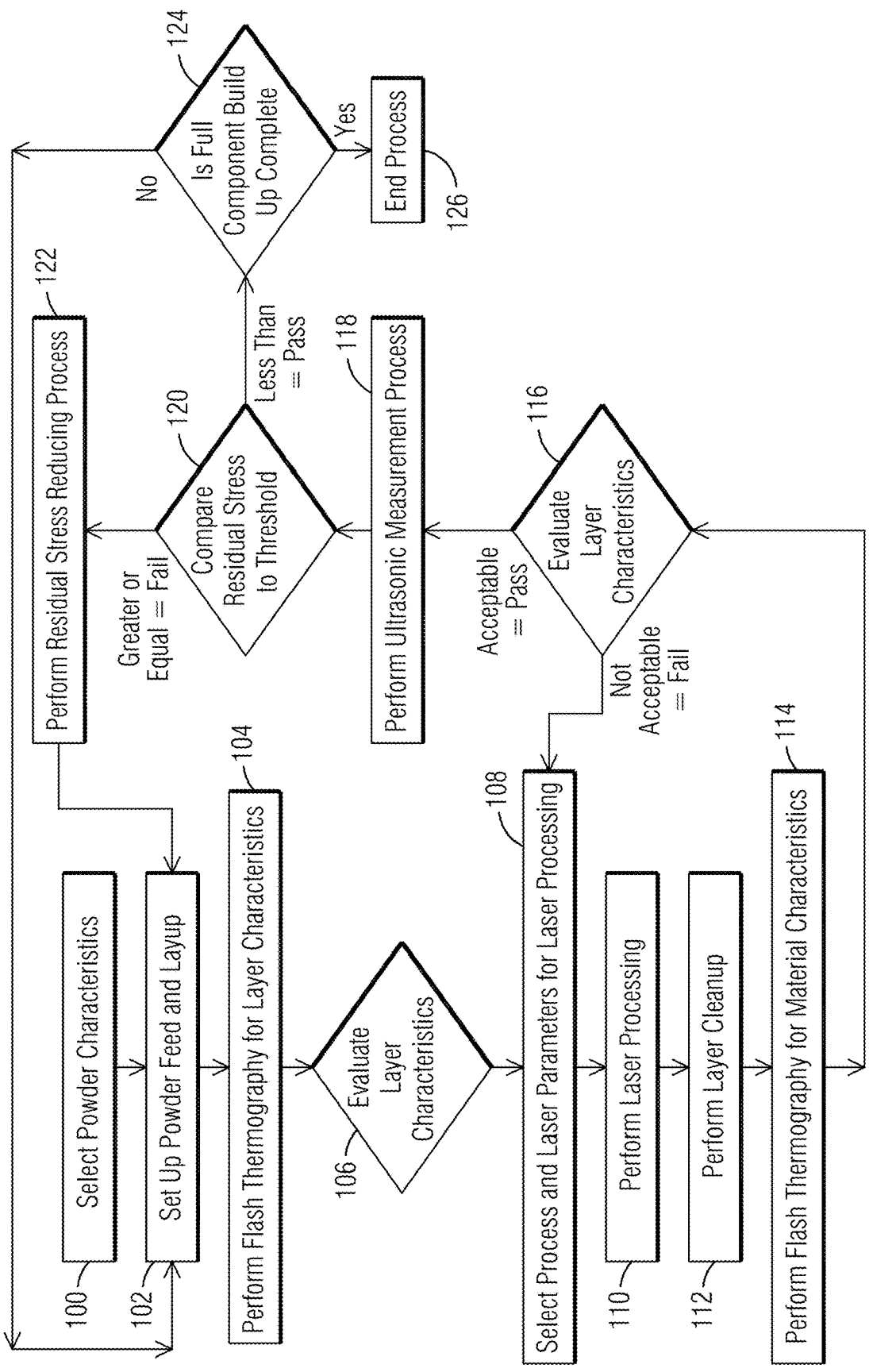
FIG. 1 is a flow chart depicting an exemplary embodiment of an additive manufacturing process of the present invention.
Figure 2:
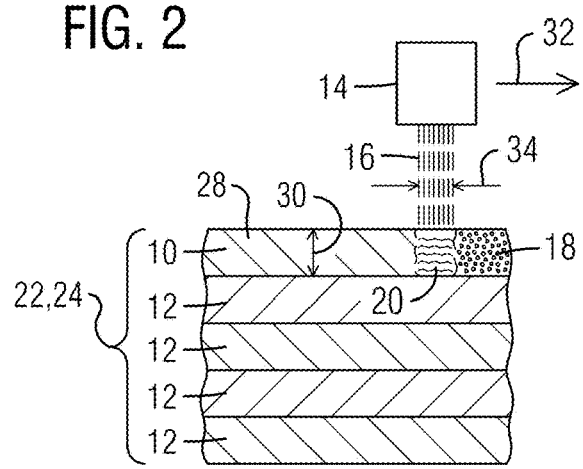
FIG. 2 depicts a laser additive manufacturing process of an exemplary embodiment of the present invention.

FIG. 1 shows a flow chart of an exemplary embodiment of an additive manufacturing process employing the steps disclosed herein. Step 100 has the powder characteristics selected for the additive manufacturing. In step 102 powder feed and layup is set up. The powder material is deposited during this step. In step 104 flash thermography for layer characteristics is performed. Results are evaluated in step 106 and incorporated into the selection of the process parameters and laser processing parameters in step 108. Step 110 includes the performing of the laser processing. Step 112 includes a layer cleanup post laser processing. An additional flash thermography is performed for material characteristics in step 114. The material characteristic is evaluated and compared to a predetermined threshold in step 116. If the material characteristic exceeds the threshold then the process returns to step 108 to be performed. If the material characteristics are within the threshold, step 118 is performed as an ultrasonic residual stress measurement process. The measured residual stress is compared to a threshold in step 120. If the residual stress exceeds the threshold value, i.e. fails a test, then step 122 is performed. Step 122 performs a residual stress reducing process such as laser shock peening. If the residual stress is lower than the threshold, it is determined if the full component build up is complete in step 124. If not, then the process is repeated starting with step 102. If a full component buildup is complete, then the process may be completed.

The process enables the precision of closed loop control for in-situ along with quick decisions for component buildup. The ability to make quick decisions while a layer is being built up or in between layers creates the component in less time. Further, by dealing with any defects while building up a layer, the process is cleaned of defects at earlier stages, and therefore, with less work to redo the piece. This process saves costs and time improving the art available.

Post buildup of the component, heat treating of the component may be completed. Further, the component may be machined or otherwise finished. Those skilled in the art will recognize that, for simplicity and clarity, the full structure and operation of all laser processing suitable for use with the present disclosure is not being depicted or described herein. Instead, only so much of a laser processing system as is unique to the present disclosure or necessary for an understanding of the present disclosure is depicted and described. The remainder of the construction and operation of laser processing may conform to any of the various current implementations and practices known in the art.

It should be appreciated that aspects of the method of additive manufacturing disclosed herein may be implemented by any appropriate processor system using any appropriate programming language or programming technique. The system can take the form of any appropriate circuitry, such as may involve a hardware embodiment, a software embodiment or an embodiment comprising both hardware and software elements. In one embodiment, the system may be implemented by way of software and hardware (e.g., processor, sensors, etc), which may include but is not limited to firmware, resident software, microcode, etc.

Furthermore, parts of the processor system can take the form of a computer program product accessible from a processor-usable or processor-readable medium providing program code for use by or in connection with a processor or any instruction execution system. Examples of processor-readable media may include non-transitory tangible processor-readable media, such as a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD and other known optical, electrical, or magnetic storage devices drives and media.

The process parameters may be provided in a database and correspond to a primary record store that comprises data from a plurality of different source data sets. Data used to populate the process parameters may originate from other databases, XML structures, and/or other data store structures. Also the process of providing data to generate the process parameters, may involve an extract/translate/load (ETL) process.

While specific embodiments have been described in detail, those with ordinary skill in the art will appreciate that various modifications and alternative to those details could be developed in light of the overall teachings of the disclosure. Accordingly, the particular arrangements disclosed are meant to be illustrative only and not limiting as to the scope of the invention, which is to be given the full breadth of the appended claims, and any and all equivalents thereof.

What is claimed is:

1. A method of additive manufacturing a component, the method comprising:
    selecting powder characterization;
    depositing powder materials for fabricating the component;
    inspecting, in-situ, the powder materials deposited to determine layer characteristics;
    selecting process and laser parameters for laser processing based on inspection results;
    laser processing the powder materials;
    performing layer cleanup on the laser processed powder materials;
    additionally inspecting, in-situ, the laser processed powder materials to determine material characteristics;
    inspecting via ultrasonic measurement process the laser processed powder materials to determine residual stress;
    upon determining residual stress is less than a threshold, repeating the above steps starting with the depositing step with additional powder materials until a buildup of the component is complete.

2. The method of claim 1, wherein the additional inspecting is via flash thermography utilizing heat powered via the preceding laser processing.

3. The method of claim 1, wherein the deposited powder layer differs in thickness from the deposited additional powder materials layer.

4. The method of claim 1, wherein inspection results identifies unacceptable characteristics, and wherein the method further comprises repeating selecting, laser processing, and performing layer cleanup steps to reduce or eliminate the unacceptable characteristics before continuing on to the inspecting via ultrasonic measurement process step.

5. The method of claim 1, wherein the inspection via ultrasonic measurement process identifies equal to or greater residual stress versus a threshold, and wherein the method further comprises a performing residual stress reducing process step before continuing with the repeating of steps starting with the depositing step with additional powder materials until a buildup of the component is complete.

6. The method of claim 5, wherein the performing residual stress reducing process step includes laser shock peening.

7. The method of claim 1, further comprising upon completing the desired component, heat treating the component.

8. The method of claim 1, further comprising upon completing the desired component, machining or otherwise finish the component.

* * * * *